United States Patent
Sprietsma et al.

(10) Patent No.: US 6,429,383 B1
(45) Date of Patent: Aug. 6, 2002

(54) APPARATUS AND METHOD FOR IMPROVING CIRCUIT BOARD SOLDER

(75) Inventors: John T. Sprietsma, Hillsboro; Steve Joy, Portland; Bryce Horine, Aloha, all of OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/291,724

(22) Filed: Apr. 14, 1999

(51) Int. Cl.⁷ .................................................. H05K 1/16
(52) U.S. Cl. ..................... 174/260; 174/261; 29/852; 257/698; 361/807
(58) Field of Search ................................ 174/260, 261, 174/262; 29/852, 879, 846; 361/760, 767, 807; 257/698; 228/180.1

(56) References Cited

U.S. PATENT DOCUMENTS

| | | | |
|---|---|---|---|
| 4,910,643 A | * 3/1990 | Williams | 361/414 |
| 5,249,098 A | 9/1993 | Rostoker et al. | 361/600 |
| 5,278,524 A | * 1/1994 | Mullen | 333/1 |
| 5,396,397 A | * 3/1995 | McClanahan et al. | 361/313 |
| 5,557,502 A | 9/1996 | Banerjee et al. | 361/712 |
| 5,884,397 A | * 3/1999 | Armezzani et al. | 29/852 |
| 5,970,608 A | * 10/1999 | Tighe et al. | 29/879 |
| 6,169,663 B1 | * 1/2001 | Garcia | 257/698 |
| 6,194,024 B1 | * 2/2001 | Arldt et al. | 29/846 |

* cited by examiner

Primary Examiner—Albert W. Paladini
(74) Attorney, Agent, or Firm—Schwegman, Lundberg, Woessner & Kluth P.A.

(57) ABSTRACT

A circuit board includes electrical interconnect mounting pads for mounting electronic devices thereto. Some of the electrical interconnect mounting pads include a plated through hole which traverses through the circuit board. One end of the plated through holes is closed, plugged or covered to prevent migration of solder through the plated through holes during a solder operation. The reduction in solder migration, as a result of plugging the plated through hole, increases solder joint quality over solder joint quality achieved using plated through holes which are not closed at one end.

38 Claims, 3 Drawing Sheets

APPARATUS AND METHOD FOR IMPROVING CIRCUIT BOARD SOLDER

TECHNICAL FIELD OF THE INVENTION

The present invention relates generally to circuit boards and in particular the present invention relates to circuit boards and methods for improving solder mounting.

BACKGROUND OF THE INVENTION

Electronic manufacturers use printed circuit boards to electrically connect integrated circuits, and other electrical components such as capacitors and resistors. Population densities of printed circuit boards have increased with the complexity of circuitry and the reduction in size of components. For example, computer motherboards can include hundreds of components including various integrated circuits and surface mount components.

As printed circuit board designs have increased in complexity, the need for additional interconnect lines between the components coupled to the printed circuit boards have increased. To address this need, manufactures have provided multiple layer printed circuit boards where several layers of conductors are separated by layers of dielectric material. These multiple layer circuit boards are fabricated such that the intermediate conductor layers provide power and ground planes to the printed circuit board. The outer layers of the printed circuit board, therefore, are patterned to provide the interconnects and mounting pads for components which are ultimately coupled to the printed circuit board.

The conductive layers of the multiple layer printed circuit boards are connected to each other using vias which are plated with conductive material to provide plated through holes. The vias are located across the printed circuit board and connected to mounting locations on the outer conductive planes using conductive traces. That is, mounting pads for integrated circuits and surface mount components are not directly connected to plated through holes, but are connected to the plated through hole locations using a patterned conductive trace.

For the reasons stated above, and for other reasons stated below which will become apparent to those skilled in the art upon reading and understanding the present specification, there is a need in the art for a circuit board mounting pad which does not include patterned conductive traces.

SUMMARY OF THE INVENTION

In one embodiment a circuit board comprises an electrical interconnect mounting pad located on a first surface of the circuit board, and a plated through hole traversing through the circuit board and the electrical interconnect mounting pad. The plated through hole has a first end located adjacent to the first surface of the circuit board and a second opposite end. The second end of the plated through hole is closed such that a liquid material cannot flow through the plated through hole from the first end and out the second end.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present invention is defined only by the appended claims.

Figure 1A:
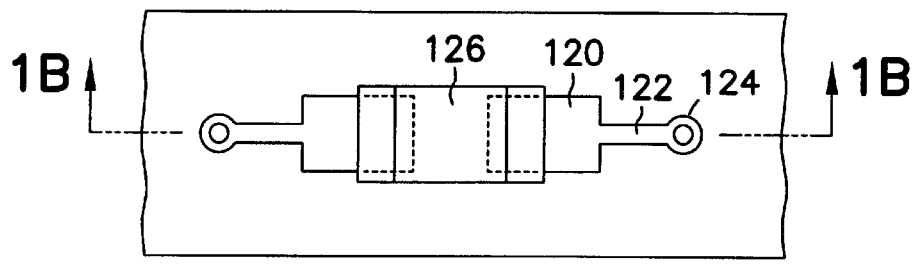
FIGS. 1a and 1b illustrate a prior art circuit board mounting pad and through hole.
Figure 1B:
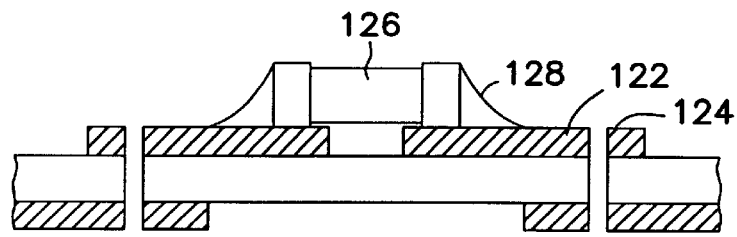

Referring to FIGS. 1a and 1b, a prior art circuit board mounting pad is described. The mounting pad is typically provided on a circuit board layer which includes traces. The mounting pad includes a pad landing area 120, interconnect trace 122, and a plated through hole area 124. A circuit component 126 is located on top of mounting pads and typically solder thereto. As seen in the circuit board cross-section of FIG. 1b, solder fillets 128 are formed on ends of the circuit device. This configuration, provides a higher than desired loop inductance as a result of the interconnect trace length.

Figure 2A:
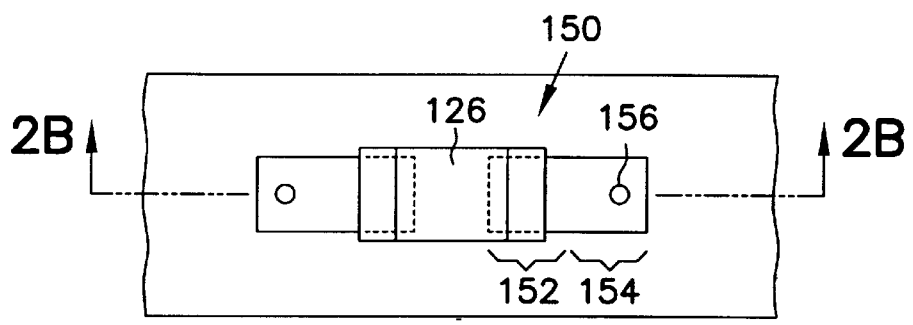
FIGS. 2a and 2b illustrate a circuit board mounting pad including a through hole.
Figure 2B:
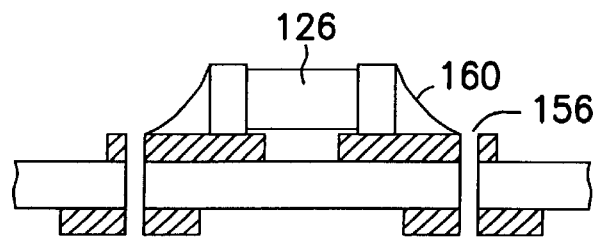

Referring to FIGS. 2a and 2b, a new mounting pad 150 is described which includes a via, or plated through hole, traversing through the pad surface. The mounting pads include a landing area 152 in which a circuit device 126, or other component, comes into physical contact with the pad. As shown in FIG. 2b, the plated through hole 156 is located on the mounting pad in the location 154 which is not underneath the circuit component. A reduction in inductance of the resultant circuit is achieved over the circuit of FIG. 1a because the conductive distance between the component mounted on the circuit board and the plated through holes are decreased. A problem, however, can be experienced in soldering the circuit component to the mounting pads when the plated vias are located close to, but outside of, the circuit device. That is, creating solder fillets 160 on the outside edge of the circuit device can be difficult when the plated through holes are located where the solder fillet is desired, FIG. 2b.

Figure 3A:
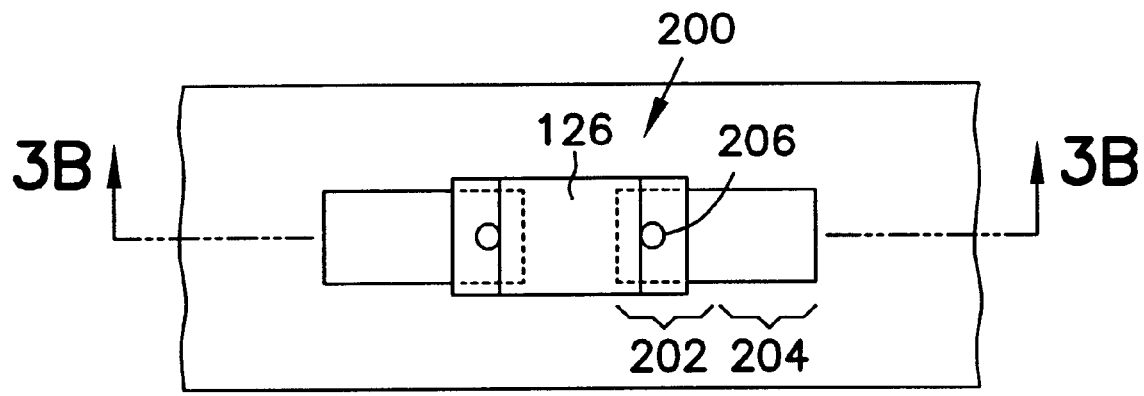
FIGS. 3a and 3b illustrate another circuit board mounting pad including a through hole.
Figure 3B:
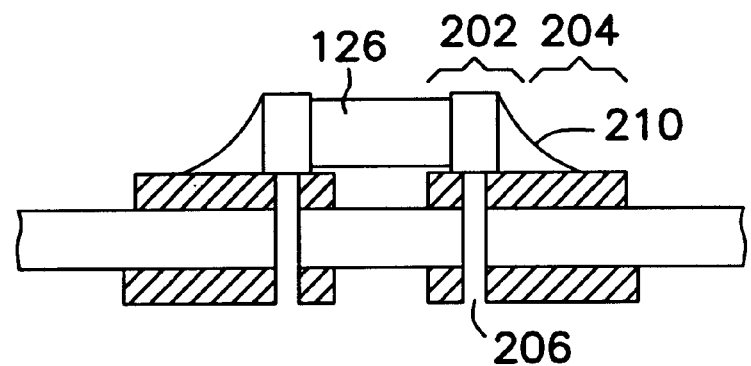

To address solder problems, a printed circuit board can be fabricated with mounting pads 200 having plated vias located under circuit components. Referring to FIGS. 3a and 3b, mounting pads are illustrated for receiving an electrical component 126, such as a circuit capacitor. The mounting pads, therefore, are sized such that a first portion 202 of the mounting pad physically supports the electrical component. A second portion 204 of the mounting pads provide an area for soldering the components to the mounting pads. By locating the plated vias 206 under the circuit component, more uniform solder fillets 210 can be achieved.

Although providing a plated through hole located in the mounting pad provides certain benefits, mounting circuit components to the mounting pads can create new difficulties.

One such difficulty is a tendency for solder to flow through the plated through hole during a solder operation. It will be appreciated by those skilled in the art that having solder flow into the via reduces the quantity of solder available to attach the component to the mounting pad. As such, the quality and integrity of the resultant solder joint is compromised. The present invention reduces, or eliminates, the amount of solder which flows into the plated through hole during soldering operations. In one embodiment, the present invention provides a method of manufacturing a circuit board. The method includes forming a mounting pad on one surface of the circuit board, providing a plated through hole which traverses through the mounting pad and the circuit board, and capping one end of the plated through hole. One technique which can be used to form the plated through hole, is to provide a conductive mounting pad, drill a hole through the conductive mounting pad and the circuit board, and provide a conductive coating over the mounting pad and an interior surface of the hole. Other techniques, however, can be used to form the plated through hole. Once the plated through hole is provided, one end of the hole is plugged, or capped, as described in greater detail below. In general, the plated through hole is plugged such that a liquid, for example molten solder, cannot flow through the plated through hole from one end and out a second end of the hole. It will be understood that the entire plated through hole does not need to be filled, and that some solder can flow into the plated through hole to fill portions of the plated through hole which have not been filled or capped. If the plated through hole is described as a cylinder having a length L and a diameter D, the plated through hole is considered "closed" for purposes of the present invention if a substantial portion of D is closed anywhere along L (including the very end). As explained, the purpose of closing the hole is to prevent molten solder from passing through the plated through hole. Thus, multiple techniques can be used to close the hole and achieve the desired result.

Figure 4:
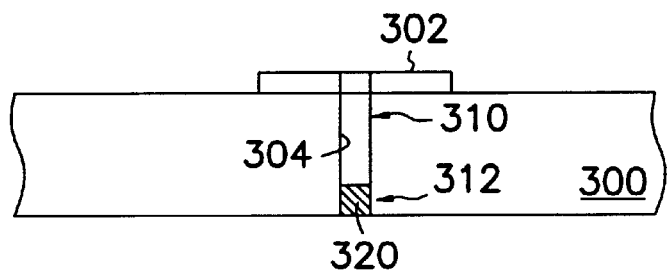
FIG. 4 illustrates one embodiment of a circuit board of the present invention.

FIG. 4 illustrates a cross section of a circuit board 300 of the present invention which includes a mounting pad 302 having an electrical interconnect via 304 located therein, as described above. The electrical interconnect via is fabricated as a plated through hole and has a top portion 310. A bottom portion 312 of the hole has been filled. The material 320 used to fill the hole, in one embodiment, is epoxy. It will be appreciated that other materials can be used to fill a portion of the plated through hole, including both conductive and nonconductive materials. The material used to cap the plated through holes, however, should remain in place during soldering processes. That is, the material used should have a melting point which is greater than temperatures experienced during solder reflow operations. By providing a capping material at an opposite end of the hole from the mounting location, melted solder located at the top of the plated through hole does not easily migrate into, and through, the hole. As a result, more solder material remains on the interconnect pad during device mounting operations.

Figure 5:
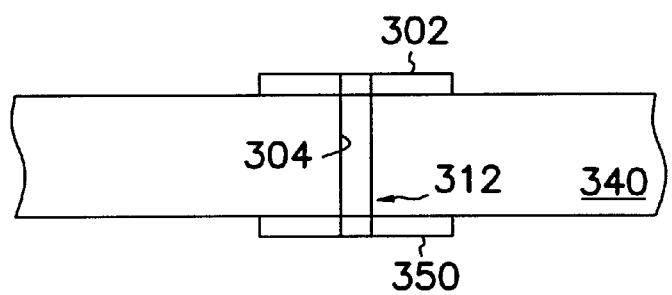
FIG. 5 illustrates another embodiment of a circuit board of the present invention.

An alternate embodiment of a circuit board 340 of the present invention is illustrated in FIG. 5. Similar to the circuit board of FIG. 4, the plated through holes are capped at a bottom region 312 to reduce the tendency of solder flow through the plated through hole. In this embodiment, however, the plated through holes are capped using a mask 350, such as a solder mask material. Any of the numerous materials known to those skilled in the art for fabricating solder masks can be used to cover the bottom end of the plated through holes.

The circuit boards described above provide an apparatus and method for increasing the quality of solder joints between circuit components and mounting pads which contain plated through holes. By insuring that the plated through hole has one end which is capped (either filled or covered), solder migration into, and through, the plated through hole is decreased. Although two specific embodiments have been described with reference to FIGS. 4 and 5, it will be appreciated that other embodiments of the present invention are contemplated. For example, a physical device, such as a pin, can be inserted into the plated through holes to provide a plug. Further, different mounting techniques can be used to attach circuitry to the mounting pads. Two different mounting techniques are illustrated in FIGS. 6 and 7.

Figure 6:
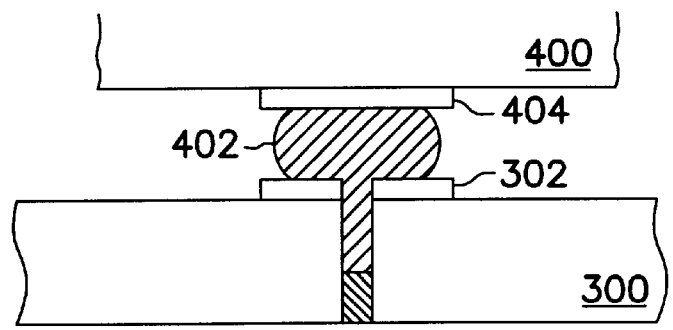
FIG. 6 illustrates a cross section of a circuit board assembly of the present invention using solder balls.

FIG. 6 illustrates a cross section of a circuit board 300 of the present invention having a device, such as an integrated circuit 400, soldered to the circuit board mounting pad. The integrated circuit is connected to the mounting pad using a solder ball 402 located between a conductive interconnect 404 on the integrated circuit and the circuit board mounting pad 302. Typically, the solder ball is attach to the integrated circuit prior to performing a solder reflow operation which melts the solder to create a bond between the integrated circuit and the circuit board. The embodiment illustrated in FIG. 6 uses a material such as epoxy to create a plug in the plated through hole. Again, by having the plated through hole capped at one end opposite the mounting pad, a stronger more reliable solder joint is created between the integrated circuit and the circuit board.

Figure 7:
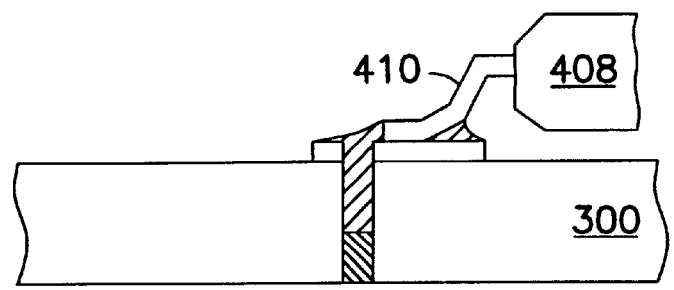
FIG. 7 illustrates a cross section of a circuit board assembly of the present invention using interconnect leads.

FIG. 7 illustrates a cross section of a circuit board 300 of the present invention having a device, such as an integrated circuit 408, soldered to the circuit board mounting pad using an interconnect lead 410. Although a different mounting technique which uses the lead in place of a solder ball is illustrated, the plated through hole is capped at an opposite end in the same manner as the circuit board of FIG. 6. FIGS. 6 and 7 illustrate circuit board embodiments using an epoxy-type material to plug one end of the plated through holes, other materials such as solder mask material can be used to reduce migration of the solder during the reflow process. Further, any electronic device can be mounted to the circuit boards illustrated in FIGS. 4 and 5, including but not limited to integrated circuit leaded packages, integrated circuit chips, and circuit components such as resistors, capacitors, and transistors.

A circuit board has been described which includes electrical interconnect mounting pads for mounting electronic devices thereto. Some of the electrical interconnect mounting pads include a plated through hole which extends through the circuit board. One end of the plated through holes is capped, plugged or covered to prevent migration of solder through the plated through holes during a solder operation. The reduction in solder migration, as a result of plugging the plated through hole, increases solder joint quality over solder joint quality achieved using plated through holes which are not capped at one end.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A circuit board comprising:
   an electrical interconnect mounting pad located on a first surface of the circuit board to receive a contact of a circuit device directly, without a separate trace thereto; and
   a plated through hole traversing through the circuit board and the electrical interconnect mounting pad, the plated through hole having a first end located adjacent to the first surface of the circuit board and a second opposite end, the second end of the plated through hole being closed such that a liquid material cannot flow through the plated through hole from the first end and out the second end.

2. The circuit board of claim 1 wherein the plated through hole is closed using an epoxy material.

3. The circuit board of claim 1 wherein the plated through hole is closed using a nonconductive material.

4. The circuit board of claim 1 wherein the plated through hole is closed using a conductive material.

5. The circuit board of claim 1 wherein the second end of the plated through hole is closed using a film located on a second surface of the circuit board, the second surface of the circuit board is opposite the first surface of the circuit board.

6. The circuit board of claim 5 wherein the film is a solder mask.

7. The circuit board of claim 1 where the plated through hole is located directly under the contact of the circuit device.

8. The circuit board of claim 7 where the contact is a solder ball located on the device.

9. The circuit board of claim 1 where the contact of the circuit device is a lead extending from the device.

10. The circuit board of claim 9 where the plated through hole is sufficiently close to the lead that solder to attach the lead also flows into the first end of the hole.

11. A circuit board assembly comprising:
an electrical interconnect mounting pad located on a first surface of the circuit board;
a circuit device soldered directly to the electrical interconnect mounting pad without an intervening trace; and
a plated through hole traversing through the circuit board and the electrical interconnect mounting pad, the plated through hole having a first end located adjacent to the first surface of the circuit board and a second opposite end, the second end of the plated through hole being closed such that a liquid material cannot flow through the plated through hole from the first end and out the second end.

12. The circuit board assembly of claim 11 wherein the circuit device is an integrated circuit device soldered to the electrical interconnect mounting pad using a solder ball.

13. The circuit board assembly of claim 11 wherein the circuit device is an integrated circuit device soldered to the electrical interconnect mounting pad using an interconnect lead.

14. The circuit board assembly of claim 11 wherein the plated through hole is closed using a nonconductive material.

15. The circuit board assembly of claim 11 wherein the plated through hole is closed using a conductive material.

16. The circuit board assembly of claim 11 wherein the second end of the plated through hole is closed using a film located on a second surface of the circuit board, the second surface of the circuit board is opposite the first surface of the circuit board.

17. The circuit board assembly of claim 16 wherein the film is a solder mask.

18. The circuit board assembly of claim 11 wherein the circuit device is a microprocessor device.

19. The circuit board assembly of claim 11 where the circuit device has a contact located directly over the plated through hole.

20. The circuit board assembly of claim 19 where the contact is a solder ball.

21. The circuit board assembly of claim 11 where the circuit device has a lead extending therefrom.

22. The circuit board assembly of claim 21 where the plated through hole is sufficiently close to the lead that solder to attach the lead also flows into the first end of the hole.

23. A method of forming a circuit board, the method comprising:
fabricating a conductive mounting pad for a circuit device on a first surface of the circuit board;
fabricating a plated through hole traversing through the conductive mounting pad and the circuit board to an opposite surface of the printed circuit board; and
thereafter closing one end of the plated through hole only from the opposite surface of the printed circuit board and not from the first surface.

24. The method of claim 23 wherein the one end of the plated through hole is closed using a conductive material deposited inside the plated through hole.

25. The method of claim 23 wherein the one end of the plated through hole is closed using a nonconductive material deposited inside the plated through hole.

26. The method of claim 23 wherein the one end of the plated through hole is closed using a film located on a second surface of the circuit board which is opposite the first surface.

27. The method of claim 26 wherein the film is a solder mask film.

28. The method of claim 23 where the plated through hole is fabricated directly under a contact of the circuit device.

29. The method of claim 28 where the contact is a solder ball located on a bottom surface of the device.

30. The method of claim 23 where the contact of the circuit device is a lead extending laterally from the device.

31. The method of claim 30 where the plated through hole is sufficiently close to the lead that solder to attach the lead also flows into the first end of the hole.

32. A method of mounting an electronic device to a circuit board having first and second surfaces, the method comprising:
providing a conductive mounting pad on the first surface of the circuit board, the conductive mounting pad including a plated through hole traversing through the conductive mounting pad and the circuit board to the second surface;
capping one end of the plated through hole only from the second surface and not from the first surface; and
forming a solder joint between a contact of the electronic device and the conductive mounting pad.

33. The method of claim 32 wherein the one end of the plated through hole is closed by filling a portion of the plated through hole prior to forming the solder joint.

34. The method of claim 32 wherein the one end of the plated through hole is closed by covering the plated through hole with a film prior to forming the solder joint.

35. The method of claim 32 where the contact of the device is soldered directly over the plated through hole.

36. The method of claim 35 where the contact is a solder ball located on a bottom surface of the device.

37. The method of claim 32 where the contact of the device is a lead extending laterally from the device.

38. The method of claim 37 where the plated through hole is sufficiently close to the lead that solder from the joint lead also flows into the plated through hole.

* * * * *

UNITED STATES PATENT AND TRADEMARK OFFICE
CERTIFICATE OF CORRECTION

PATENT NO.     : 6,429,383 B1
DATED          : August 6, 2002
INVENTOR(S)    : John T. Sprietsma, Stephen C. Joy and Bryce Horine It is certified that error appears in the above-identified patent and that said Letters Patent is hereby corrected as shown below:

<u>Title page,</u>
Item [56], U.S. PATENT DOCUMENTS, delete "*" before "3/1990".
Delete "*" before "1/1994".
Delete "*" before "3/1995".
Item [74], *Attorney*, insert -- , -- after "Kluth".

Signed and Sealed this

Tenth Day of December, 2002

JAMES E. ROGAN
*Director of the United States Patent and Trademark Office*